United States Patent
Higashikawa et al.

(10) Patent No.: US 6,319,637 B1
(45) Date of Patent: Nov. 20, 2001

(54) METHOD FOR FORMING PATTERN

(75) Inventors: Iwao Higashikawa, Tokyo; Suigen Kyoh, Yokohama, both of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/492,788

(22) Filed: Jan. 28, 2000

(30) Foreign Application Priority Data

Jan. 28, 1999 (JP) .................................................. 11-020006

(51) Int. Cl.$^7$ ........................................................ G03F 9/00

(52) U.S. Cl. .................................................. 430/5; 430/22

(58) Field of Search ................. 430/5; 1/22; 250/492.22; 382/144

(56) References Cited

U.S. PATENT DOCUMENTS 5,795,685 * 8/1998 Liebmann et al. .................. 430/5

* cited by examiner

Primary Examiner—S. Rosasco
(74) Attorney, Agent, or Firm—Finnegan, Henderson, Farabow, Garrett & Dunner, L.L.P.

(57) ABSTRACT

A main pattern region is projected to a substrate to be exposed while a defective portion including a defect generated in the main pattern region of an original mask is masked. Thereafter, a spare pattern corresponding to the defective portion is further projected on the substrate. In this manner, it is possible to prevent the defect of the main pattern region of the original mask from being transferred to the substrate. The pattern accuracy of the repair portion is the same as that of the exposed portion from the original mask. Therefore, the repair can be made with a high accuracy. Furthermore, it is possible to repair the defect produced at a pattern edge portion with a high accuracy without limitations given by a conventional repair technique.

20 Claims, 6 Drawing Sheets

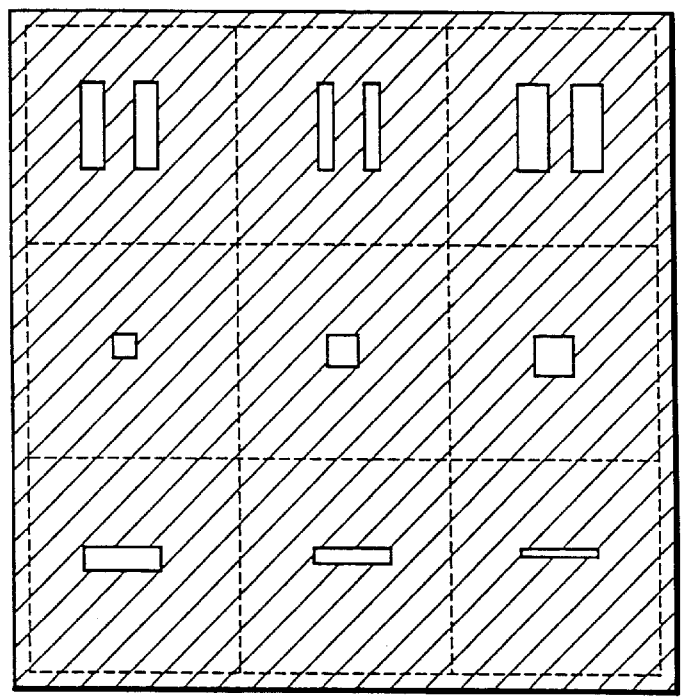
F I G. 4A
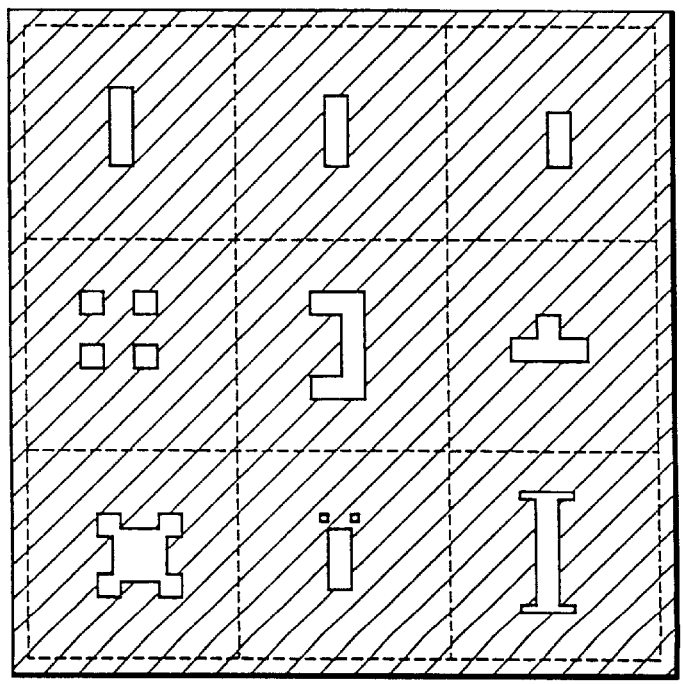
F I G. 4B

METHOD FOR FORMING PATTERN

BACKGROUND OF THE INVENTION

The present invention relates to a method of forming a pattern by transferring an original mask onto a substrate such as a photomask to be exposed to light. More particularly, the present invention relates to a method of forming a pattern for preventing a defect produced in the original mask from being transferred to the substrate to be exposed to light. Furthermore, the present invention relates to a photomask for use in the method of forming a pattern.

In a lithography technique widely used in manufacturing processes of semiconductor devices and the like, it is a great matter of concern to reduce defects as well as to improve accuracy in size and arrangement of the pattern. In the light exposure technique for preparing and transferring the original mask, defects of the original mask are transferred throughout light exposure process as common defects. Therefore, conventionally, accurate inspection and repair have been made.

In a typical light-exposure technique called an optical reduction projection exposure method, a fifth- or fourth-fold mask is usually used. In the manufacturing steps of the photomask, a raster or vector scan exposure method using an electron beam or a laser beam is generally used. Furthermore, it is known that an photomask is manufactured by applying a technique in which an LSI pattern is reduced and transferred from an original mask using an optical reduction projection exposure method.

The defects in the original mask have been repaired by using various repair techniques to a level having no effect upon the transfer results. However, as a size of the LSI pattern comes closer to a resolution limit of the optical projection exposure method with miniaturization of the semiconductor devices, it has been difficult to repair the defects to the level having no effect upon the transfer results.

To repair the defects of the photomask, employed are a method of removing an opaque film by a laser beam, a method for forming an opaque film by depositing of a carbon film using a focused ion beam (FIB) and so forth. However, it is difficult to repair defects with an accuracy of 50 nm or less due to limitations in size and alignment of the beam. Furthermore, in the case where Ga ions etc. are implanted into a quartz substrate for repair, optical characteristics of the repaired portion and the peripheral region thereof are degraded. Alternatively, in the repaired portion, the opaque film is not formed with a desired sectional profile of the end portion. As a result, a transferred image is degraded.

In a conventional pattern formation method for forming an LSI pattern on the substrate to be exposed to light (hereinafter, simply referred to as "substrate") such as a photomask by use of the original mask, repairing the defects is a great matter of concern. It has become more difficult to repair the defects so as not to have an effect upon the transfer results with the miniaturization of the device. It is difficult to repair the defects with a sufficient repair accuracy after being transferred to the substrate because of limitations of a beam in size and alignment. In addition, some regions are degraded in optical characteristics after repair, or when an image is transferred onto the repaired portion, the transferred image is degraded. In particular, due to limitations in the defect repair technique, it is difficult to repair the defects produced in the pattern edge portion with a high accuracy.

BRIEF SUMMARY OF THE INVENTION

An object of the present invention is to provide a method of forming a pattern capable of preventing a defect produced in an original mask from being transferred to a substrate to be exposed and capable of repairing a defect produced at an edge portion of the pattern with a high accuracy without limitations given by a conventional defect repair technique.

Another object of the present invention is to provide a photomask for use in the method for forming a pattern.

To attain the aforementioned objects, the method of forming a pattern according to a first aspect of the present invention comprises the steps of:

selectively forming an opaque film on defective portions including defects of a main pattern region of an original mask on which an LSI pattern is formed, to prevent the defective portions from being transferred;

transferring the main pattern region of the original mask to a substrate to be exposed; and transferring at least one spare pattern to a portion of the substrate corresponding to each of the defective portions of the original mask.

The step of forming the opaque film includes the steps of:

forming an LSI pattern at least in the main pattern region of the original mask on the basis of a design data;

performing defect inspection for the LSI pattern formed on the original mask to detect positions and types of the defects;

repairing a repairable defect of the defects; and forming the opaque film on each of the defective portions including a non-repairable defect of the defects to prevent the non-repairable defect from being transferred onto the substrate.

The step of forming then opaque film includes the steps of:

forming a large main pattern on the main pattern region of the original mask on the basis of a design data;

performing defect inspection for the main pattern formed on the original mask to detect positions and types of the defects; and forming the opaque film on each of the defective portions including a defect selected from the defects of the main pattern to prevent the defective portions from being transferred onto the substrate, and the step of transferring at least one spare pattern on the substrate includes the steps of:

obtaining data on figure patterns and positions of the defects under the opaque film from one of the design data and an original mask pattern data of the defective region, thereby obtaining a light exposure data for the at least one spare pattern; and projecting at least one of the figure patterns of the defects onto a selected region of one of the original mask and another original mask to form the at least one spare pattern.

The method of forming a pattern according to a second aspect of the present invention comprises the steps of:

preparing light exposure data of an LSI pattern including a large main pattern and at least one small spare pattern, the at least one small spare pattern being constituted of at least one simple figure pattern;

forming the large main pattern and the at least one small spare pattern on at least one original mask;

performing defect inspection for the large main pattern to determine positions and types of the defects;

forming an opaque film on a defective portion including a defect selected from the defects of the large main pattern, to prevent the defect selected from being transferred onto the substrate;

transferring the large main pattern of the at least one original mask onto a predetermined region of the substrate; and selectively transferring the at least one small spare pattern onto the defective portion of the at least one original mask with the opaque film formed thereon, to recover a desirable figure.

The at least one simple figure pattern is desirably at least one figure pattern repeatedly emerging in the main pattern.

In the first and second aspects, the substrate to be exposed is desirably a photomask.

The photomask according to a third aspect of the present invention comprises a mask substrate;

a large main pattern formed on a region of the mask substrate;

at least one small spare pattern formed on another region of the mask substrate, the at least one small spare pattern being constituted of at least one simple figure pattern; and an opaque film covering a predetermined region including a defect of the large main pattern.

The at least one simple figure pattern includes at least one figure pattern repeatedly emerging in the large main pattern.

In the present invention, desirable embodiments are as follows:

1. The at least one spare pattern may be formed on a spare pattern region or on another original mask but not on the main pattern region of the original mask.

2. The at least one spare pattern is selected from the group consisting of a square, a rectangle, a parallelogram having one angle of 15°, 30°, 45°, 60° and 75°, an isosceles triangle two identical angles of which include one angle of 15°, 30°, 45°, 60° and 75°, and a right triangle having one angle of 15° and 30°.

3. The at least one spare pattern includes a plurality of patterns identical in shape and different in size.

4. The at least one spare pattern has a portion overlapped with a non-defective portion of the main pattern.

According to the present invention, while a defective region including a defect produced in a main pattern region of an original mask is masked, the main pattern region is projected onto a substrate to be exposed. Furthermore, a spare pattern corresponding to the defective region is separately projected to the substrate. In this manner, it is possible to prevent the defect produced in the main pattern region of the original mask from being transferred onto the substrate. More specifically, the original mask from which a pattern of a defective portion is once removed, is projected, and then a non-defective pattern of the defective portion is transferred by the same light exposure apparatus continuously from the light exposure of the original mask. Thereafter, development and etching are performed, thereby repairing the defective portion in the light exposure step.

The repaired portion is projected in the same accuracy as in the portion obtained by pattern exposure from the original mask. Therefore, repair can be made with a high accuracy. In addition, it is possible to repair the defect produced at a pattern edge portion with a higher accuracy without limitations given by a conventional defect repair technique.

If the present invention is applied to manufacturing steps for, particularly, a photomask for used in a memory device, a large effect can be obtained. In the photomask of this type, a unit of a memory cell pattern is regularly repeated in almost a half area thereof. Therefore, if the unit of a memory cell pattern is prepared at a margin of the original mask, a defect produced in the memory cell region can be easily repaired. Similarly, if a unit pattern figure frequently used is prepared at the margin, an applicable range of the present invention is markedly broadened. Furthermore, the present invention can be applied to an arbitrarily chosen figure pattern if a desired pattern is formed by combining small figure patterns.

Furthermore, different from an isolated opening pattern, when a defect is produced in a figure having a long opening portion as is in a space portion of a line-and-space pattern, the opaque film covers the midst of the opening portion in the step of covering a defective region with the opaque film by use of a repair apparatus according to the present invention. When the repair is performed by projecting a pattern identical in size to the space portion covered with the opaque film, a failure in connection is produced at a boundary region due to optical characteristics called an optical proximity effect. More specifically, the failure in connection includes rounding produced at a corner portion and a reduction in length of a fine pattern.

To overcome these defects, the present invention employs a method in which a shape of pattern to be projected to the defective region is changed to have a wedge portion to minimize the deformation of the figure to be synthesized through two light exposure operations. In this way, the accuracy is improved. The figure to be produced can be predicted by use of an optical image simulation method. To explain more specifically, the figure to be formed on the original mask is predicted based on an opening portion around the opaque film covering a defective portion and a desired pattern in consideration of optical characteristics of a light exposure apparatus. If the original mask is formed by using this technique, it is possible to transfer a pattern to a defective portion with a high accuracy.

Furthermore, if the present invention is applied to form an original mask, such as a photomask, which requires to be formed non-defectively, it is possible to repair a defective portion without decreasing the accuracy in dimension despite the limited accuracy given by an FIB defect repair apparatus or a laser repair apparatus.

Furthermore, the light-exposure step can be automatically performed by obtaining a positional data, that is, a coordinate data of a defect on the basis of defect inspection data in combination with a design data, and then combining the obtained positional data with a repair pattern data in the original mask, thereby automatically providing a light exposure instruction data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4A and 4B are views for explaining examples of the spare pattern formed in a margin of the original mask;

DETAILED DESCRIPTION OF THE INVENTION

Now, the present invention will be described with reference to the accompanying drawings.

(First Embodiment)

There will be explained an embodiment in which the present invention is applied to manufacturing of a photomask.

The photomask is manufactured by the steps of forming an original mask and transferring a pattern of the original mask to a blank coated with a resist by using a reduction projection exposure apparatus.

First, an enlarged pattern 20 times as large as that finally projected onto the semiconductor substrate, was formed on the original mask. In this embodiment, a main pattern is used for forming a chip of 6.28 mm×12.38 mm on the semiconductor substrate. In a region (125.6 mm×99.04 mm) on a 6-inch photomask, patterns corresponding to 10 chips, each 4 times as large as the main pattern, are arranged in a 5×2 matrix form. As an original mask for a chip pattern, two masks each 20 times as large as an actual chip-pattern size were prepared. Into each of the two original masks, a pattern corresponding to a half of the chip pattern was formed.

Figure 1A:
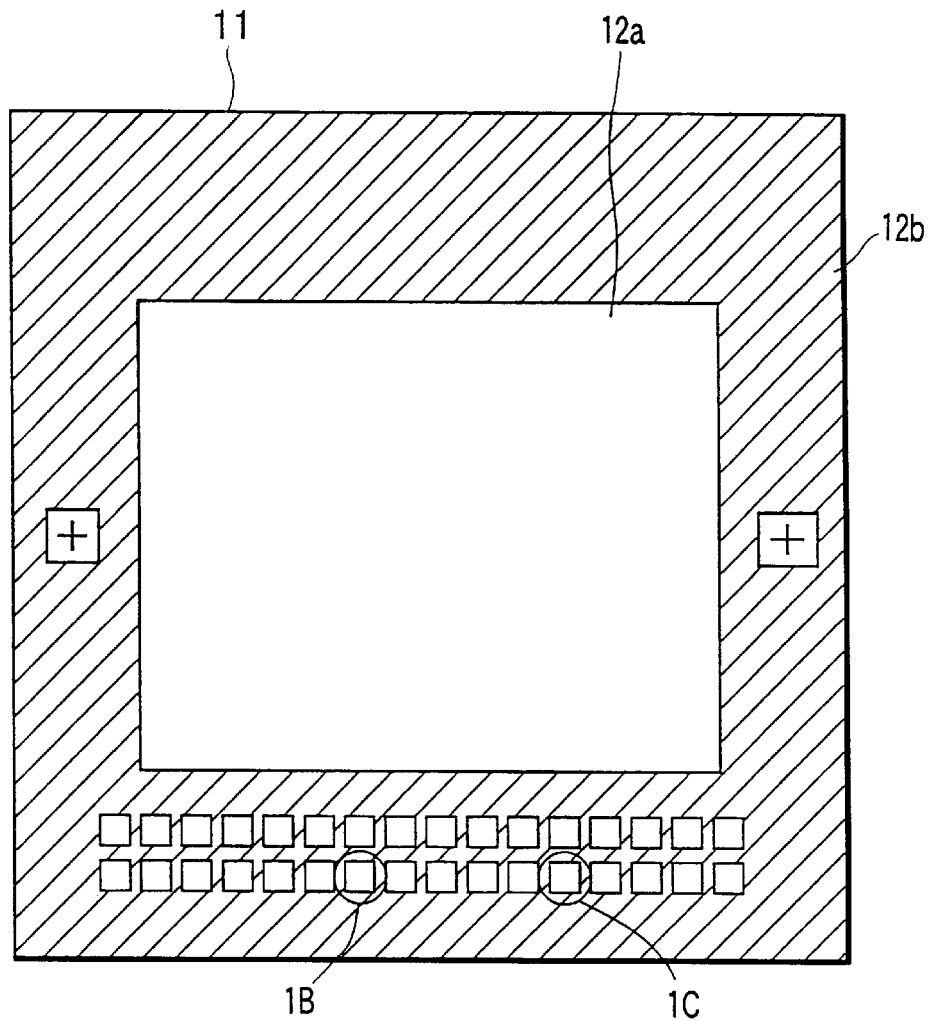
FIG. 1A is a plan view showing a structure of an original mask used in a pattern formation method according to a first embodiment of the present invention.
Figure 1B:
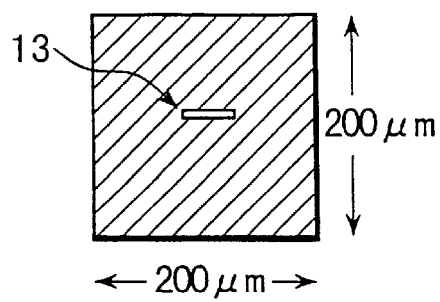
FIG. 1B is a magnified plan view of a portion 1B of FIG. 1A.
Figure 1C:
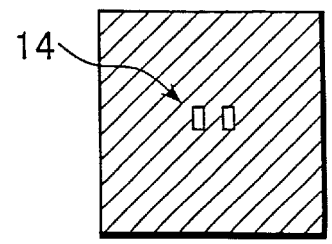
FIG. 1C is a magnified plan view of a portion 1C of FIG. 1A.

To explained more specifically, as shown in FIG. 1A, a chip pattern corresponding to a half of the chip was arranged at a center region 12a (main pattern region) of a mask substrate 11. In the peripheral region (spare pattern region) 12b, element patterns frequently used in the chip pattern were arranged individually at centers of 200 $\mu$m square regions. Two identical patterns were prepared for each element. As types of patterns, prepared are patterns for a memory cell region (e.g., reference numerals 13, 14 of FIGS. 1B, 1C), opening patterns for a peripheral circuit region: 0.25 $\mu$m square, 0.2 $\mu$m×0.5 $\mu$m, 0.5 $\mu$m×0.2 $\mu$m, 0.24 $\mu$m×0.24 $\mu$m, 0.26 $\mu$m×0.26 $\mu$m, 0.2 $\mu$m×1.0 $\mu$m, 1.0 $\mu$m×0.2 $\mu$m, 0.2 $\mu$m×0.5 $\mu$m. These pattern regions were arranged at a spacing of 175 $\mu$m.

Exposure data was first prepared to form the original mask. The exposure data for forming a 20X original mask was prepared by processing a pattern data of the chip in consideration of a mirror, rotation and so forth of the exposure apparatus. Furthermore, in consideration of the shift in pattern size in the manufacturing steps, processing called sizing was carried out for altering a pattern size.

As the blank for forming the 20X original mask, a quartz substrate (manufactured by HOYA Corporation, 6025 specification) was employed. On a main surface of the quartz substrate, an opaque film was formed by using chrome and chrome oxide. A photoresist was applied thereon as a photosensitive material. The opaque film was formed in a thickness of 0.1 $\mu$m. The photoresist is formed in a film thickness of about 0.5 $\mu$m. Then, a predetermined baking treatment is performed.

After pattern exposure was performed in a dose of 100 mJ/cm$^2$ by using a laser beam exposure apparatus (manufactured by ETEC), baking was performed at 100° C. for 7 minutes in order to reduce a standing wave effect. After the temperature of the substrate returned to a room temperature, development was performed by spraying a special alkaline developing solution containing TMAH (tetramethylammonium hydride) as a main component. Immediately after the spray development of 75 seconds, the substrate was rinsed with pure water and further subjected to spin drying.

Subsequently, the opaque film was etched by dry etching using a gas mixture of chlorine and oxygen. The dry etching was performed longer by 75% than the time required for etching a large opening portion. Thereafter, the resist film was removed, size and position of the pattern were measured. In this manner, it was confirmed that the pattern was formed with a predetermined accuracy.

Then, defect inspection was performed on a pattern data basis. More specifically, the defect inspection was performed by using a defect inspection apparatus (manufactured by Toshiba Machine Co., Ltd.) in a mode detectable a defect to 0.35 $\mu$m. As a result, three defects were detected from each of two original masks. Two of them were pin holes. The rest four defects were produced by the opaque film left behind. Of the four defects due to the remaining opaque film, two were difficult to be repaired since the defects were produced by the residual opaque film attached to an edge of an opening portion. The rest two defects were isolated dots. The accurate pattern position was determined by a placement measurement tool (LMS-iPRO: manufactured by Leica Corporation) and simultaneously confirmed by the exposure data.

Figure 2A:
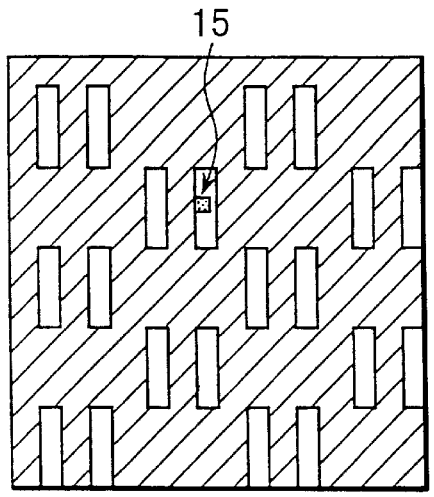
FIG. 2A is a view for explaining a defect generated in the pattern of the original mask.
Figure 2B:
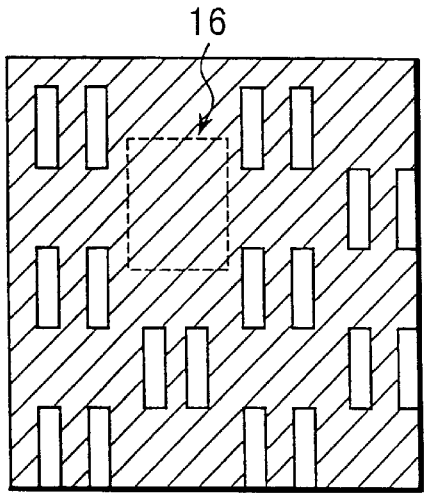
FIG. 2B is a view for explaining the original mask in which the defect is covered with a carbon film.

Then, a carbon film was deposited by using an FIB defect repair apparatus (SIR-3000: manufactured by SII). To repair the pin-hole defect, deposition with the carbon film was made slightly larger than the pin hole, including the peripheral region. As shown in FIG. 2A (a magnified pattern view of a memory cell portion), the defect 15 of the memory cell pattern region protruded from an edge of a pattern opening portion. To repair such a defect, deposition with the carbon film 16 was made slightly larger than the entire opening portion, as shown in FIG. 2B. Another defect due to the opaque film attached to an edge portion of the opening was a rectangular opening (design size 0.2 μm×1.0 μm) produced in a region (not shown) corresponding to a peripheral circuit. The carbon film was also deposited over the entire rectangular opening.

Subsequently, an original mask was taken out from the FIB defect repair apparatus and the isolated dot-form defect of the opaque film was removed by using a laser repair apparatus (SL 453C, manufactured by NEC corporation).

Figure 3A:
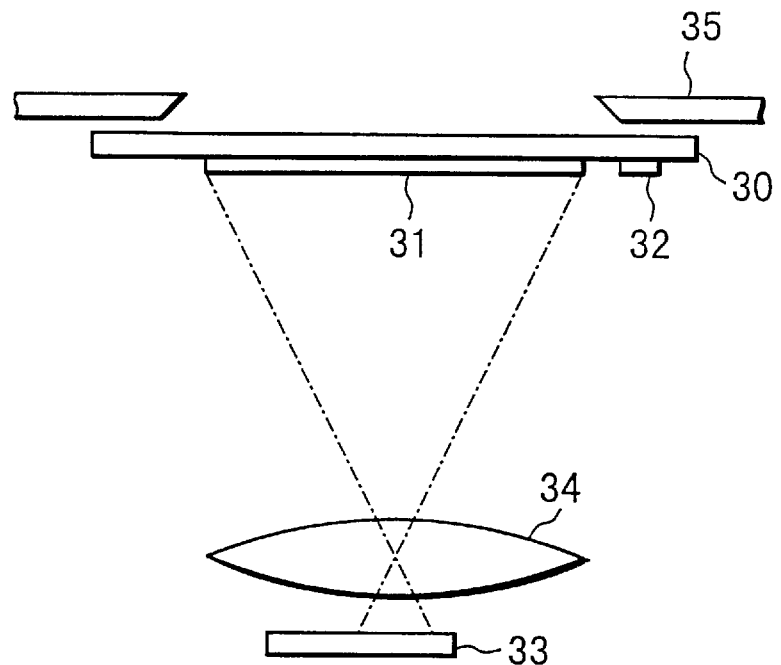
FIGS. 3A and 3B are schematic views respectively showing how to transfer a main pattern region and a spare pattern region formed on the original mask.

After cleaning and inspection for defect, the original mask was placed in the reduction projection exposure apparatus. The substrate to be exposed was a blank formed of the same material as the original mask. In one of the two original masks (a first original mask), the chip pattern (½ of the main pattern) was transferred at a contraction rate of ⅕. The light exposure was sequentially performed chip by chip to 5×2 chips. The relationship between the original mask and the photomask blank is shown in FIG. 3A. In the figure, reference numerals 30, 31, and 32 denote an original mask, a main pattern region, and a spare pattern region, respectively. Reference numerals 33, 34, and 35 are a photomask blank, a projection lens, and a blind, respectively.

Figure 2C:
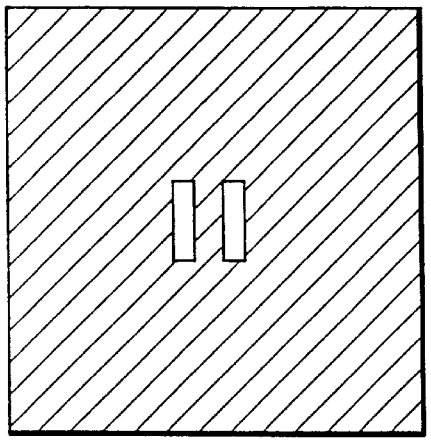
FIG. 2C shows a spare pattern of the original mask for defect repair.
Figure 2D:
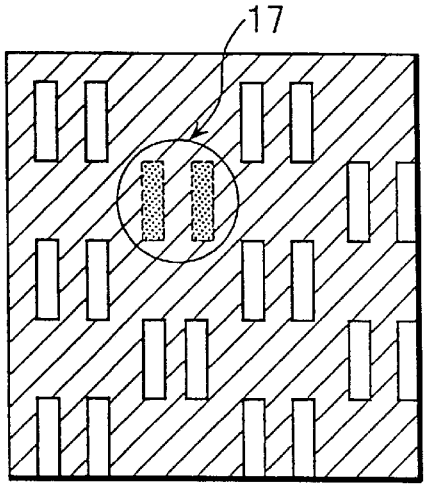
FIG. 2D is a plan view of a pattern on the substrate to be exposed to light for explaining a method of transferring the spare pattern of FIG. 2C.
Figure 3B:
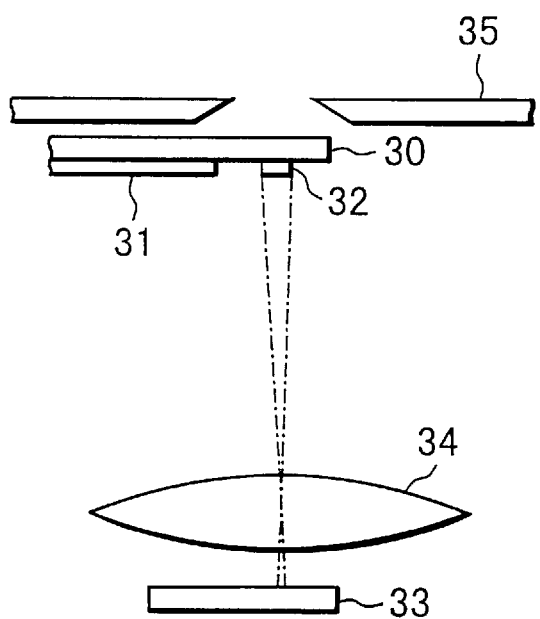

Then, repair was performed by the repair apparatus. More specifically, a spare cell-pattern (shown in FIG. 2C) formed in a margin of the original mask 30 (FIG. 3A) was projected onto a position of the photomask lacking in a cell pattern, as shown in FIG. 2D. The exposure was sequentially performed on every chip of 5×2 arrangement. The portion represented by reference numeral 17 in the FIG. 2D is a light-exposure position. The relationship between the original mask 30 and the photomask blanks 33 at this time is shown in FIG. 3B.

Subsequently, the first original mask was replaced with the reminder original mask (a second original mask) and a position is aligned so as to connect the patterns of the first and second original masks. The exposure was sequentially performed every chip of 5×2 arrangement. Of the patterns formed in the margin portion of the original mask, the pattern of the rectangular opening portion (0.2 μm×1.0 μm) was projected to a portion covered with the carbon film deposited by the defect repair apparatus and having no pattern transferred. After the exposure to 5×2 chip arrangement, the second original mask was taken out. Then, marks to be required at the wafer exposure processing were selected from various types of marks separately prepared on another original mask and projected to a region outside the chip region.

Subsequently, the blank was taken out from the light-exposure apparatus. The post exposure baking was performed at 100° C. for 7 minutes to reduce a standing wave effect in the same manner as in the manufacturing steps of the original mask described above. After the temperature of the substrate was returned to a room temperature, development was performed by spraying a special alkaline development solution containing TMAH as a main component. After the development of 75 seconds, the blank was immediately rinsed with pure water and further subjected to spin drying.

Then, an opaque film was dry-etched by using a gas mixture of chlorine and oxygen. The dry etching was performed longer by 75% than the time required for etching a large opening portion. Thereafter, the resist film was removed, size and position of the pattern were inspected. Forty opening patterns of 1.05 μm in design width was measured on the blank. As a result, it was confirmed that variation of 3σ was 23 nm. In addition, positional accuracy was obtained by removing magnification errors in the directions X and Y, thereby calculating the reminder arrangement error. As a result, the positional accuracy of the pattern was 26 nm as a variation of 3σ.

Figure 2E:
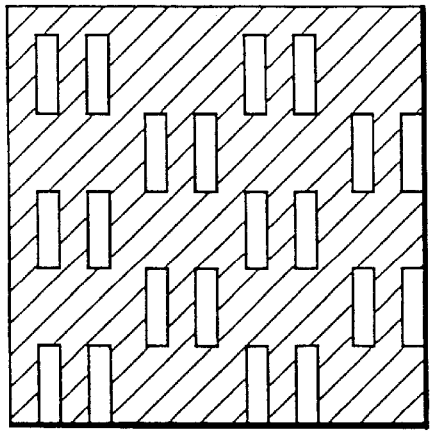
FIG. 2E shows a pattern on the substrate at the time the transfer is completed.

Then, a die to database inspection using a defect inspection apparatus (manufactured by Toshiba Machine Co., Ltd.) and pattern defect inspection were performed by comparing patterns in accordance with a inspection method called "die to die" using a defect inspection apparatus (manufactured by KLA-Tencor). As a result, as shown in FIG. 2E, no defects were detected at a position of the photo-blank (photomask) corresponding to the defective portion of the original mask. In addition, a new defect presumably produced in this step was not observed.

Figure 2F:
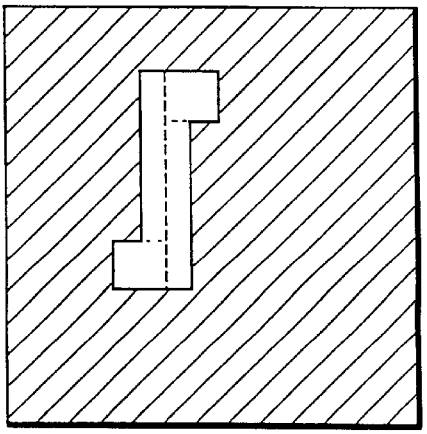
FIG. 2F shows a pattern on the substrate for explaining a method of synthesizing a complicated figure by combining simple patterns.

In the foregoing, the present invention was explained with reference to the embodiment. As the spare patterns to be formed in the margin portion of the original mask, it is desirable to use figure patterns which frequently emerge in a chip, as shown in FIGS. 4A and 4B. In particular, to repair a defect in a repeating pattern such as a memory cell pattern, for example, it is desirable that a figure pattern to be used repeatedly be employed as the spare pattern. Furthermore, for forming a non-defective pattern without fail by repairs, it is useful to arrange a plurality of figure patterns identical in shape and slightly different in size in the margin of the original mask. Alternatively, a complicated figure pattern may be formed by combining simple figures indicated by a broken line in FIG. 2F.

(Second Embodiment)

There will be explained another embodiment in which the present invention is applied to manufacturing a photomask.

Figure 5A:
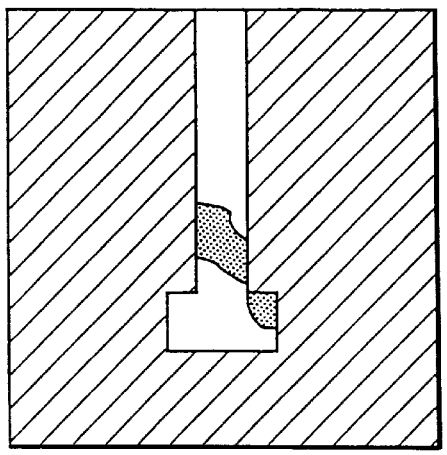
FIG. 5A is a view for explaining defects generated on a pattern of the original mask according to a second embodiment of the present invention.
Figure 5B:
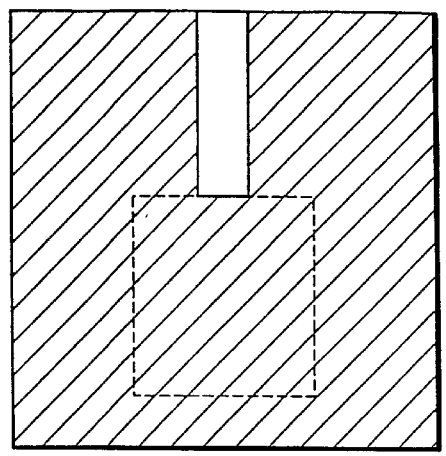
FIG. 5B is a view for explaining the original mask in which the defect is covered with a carbon film.
Figure 5C:
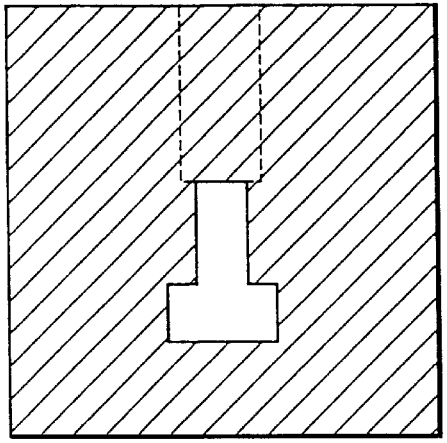
FIG. 5C shows a spare pattern theoretically obtained for defect repair.

After the first original mask was formed in the same manner as in the first embodiment, the main pattern was checked for a defect. For the defect, a position and a shape was determined. As a result, a defect of an irregular-shape was found at an opening end portion as shown in FIG. 5A. Then, a carbon film was deposited in a rectangular form on the defective portion of the first original mask as shown in FIG. 5B. After the carbon film was deposited, the size of the original opening of the covered portion was obtained by comparison with a design data. As a result, it was confirmed that the opening has a size shown in FIG. 5C.

Figure 5D:
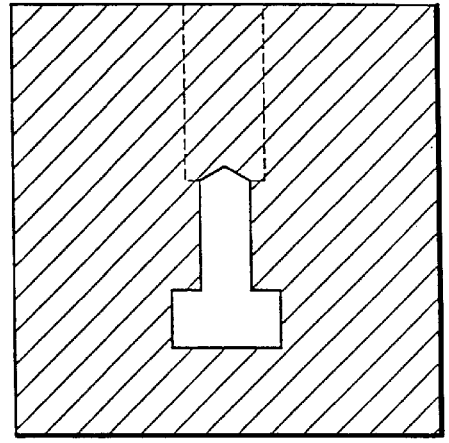
FIG. 5D shows a spare pattern for repair in which a protruded portion of a wedge form is added to the spare pattern of FIG. 5C.

Subsequently, the defective portion was compared with a light-exposure data and a positional pattern data was taken out. Simultaneously, data of the figure pattern (having a wedge-form projection at a connecting portion shown in FIG. 5D) for the opening portion was prepared. Then, the figure pattern data obtained above was projected onto the second original mask together with figure patterns in preparation for other defects. As a result, 9 identical patterns were arranged in a sufficient distance from each other on the second original mask. Laser beam exposure was performed by changing an exposure amount by three steps for every three patterns. Patterns were formed so as to differ in size by about 25 nm from each other. The pattern exposed in the least exposure amount is the closest size to the defective portion mentioned above.

Figure 5E:
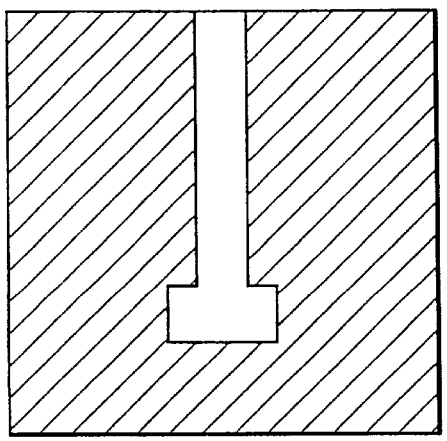
FIG. 5E shows a pattern of the substrate on which the pattern transfer is completed.
Figure 5F:
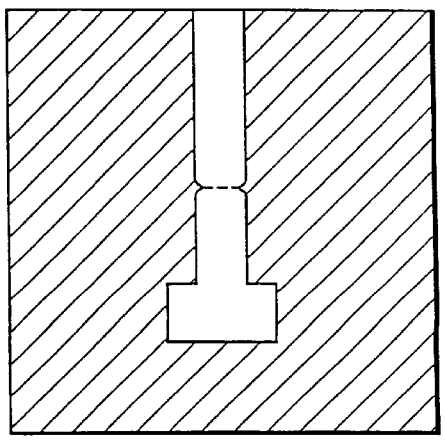
FIG. 5F shows a pattern on the substrate for explaining a defect of the pattern on the substrate presumably produced when the spare pattern theoretically formed in FIG. 5C is synthesized with the original mask pattern of FIG. 5B.

As is the same as in the first embodiment, the blank serving as a substrate was prepared of the same material as that of the original mask. Then, the main pattern of the first original mask was exposed. Then, a pattern having a size closest to a defective portion covered with an opaque film was selected from the second original mask to project. As a result, a normal photomask pattern shown in FIG. 5E was obtained. Since the figure data was partly changed into a wedge form, necking (shown in FIG. 5F) of the connecting portion was not observed against prediction.

Figure 6A:
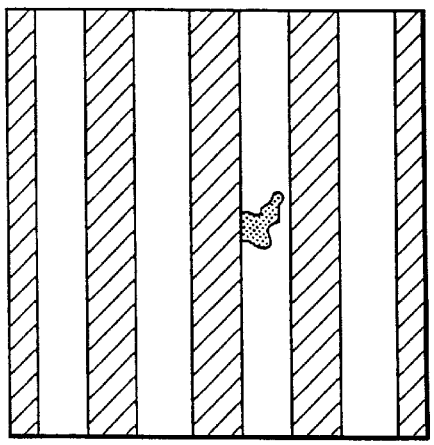
FIGS. 6A–6E show a method for repairing a defect of an original mask of a line-and-space pattern according to a modified example of the second embodiment (FIGS. 6A–6E correspond to FIGS. 5A–5E, respectively)
Figure 6B:
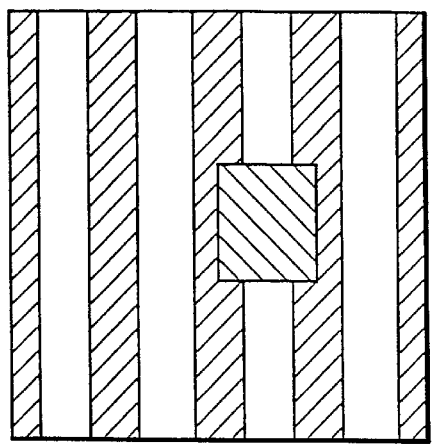
Figure 6C:
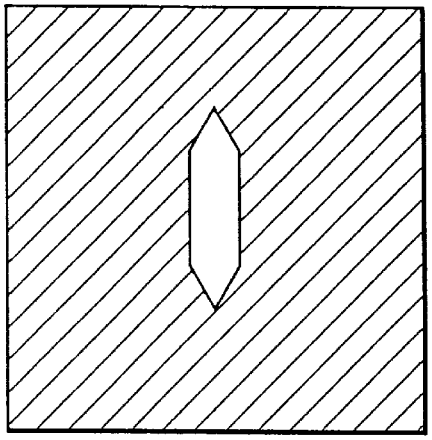
Figure 6D:
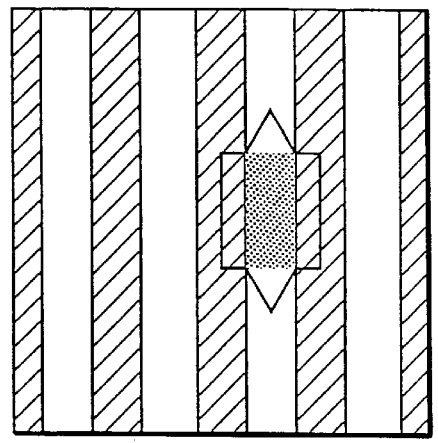
Figure 6E:
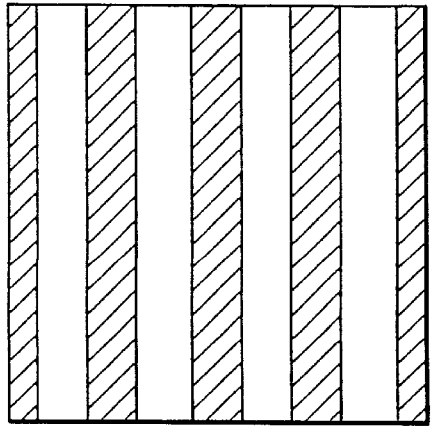
Figure 6F:
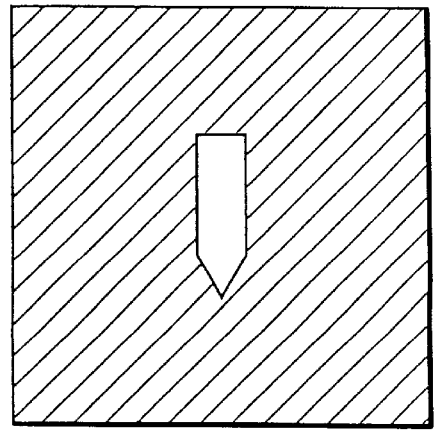
FIG. 6F is an example of a spare pattern for repairing a defect at an end terminal portion of the line-and-space pattern.

In the embodiments, the method for repairing a defect by forming an opaque film over a part of the opening portion has been explained. In the case of the pattern such as a line-and-space pattern, the opaque film was formed on an opening region, that is, a space pattern. As a consequence, a spare pattern must be projected in such a manner that both ends of this spare pattern are respectively connected to the opening portion. This case is shown in FIGS. 6A–6E which correspond to FIGS. 5A–5E of this embodiment. As shown in these figures, the figure of the spare pattern is deformed partly into a wedge from at upper and lower ends. It is therefore possible to form a pattern having less edge roughness and excellent in size accuracy. When a defect is produced at an end portion of a long space pattern, the opening portion (space pattern) is ended at the end portion having the defect. In this case, it is useful to employ a pattern one end of which is shaped normal and the other end of which has a wedge form as shown in FIG. 6F.

To prepare the figure more precisely, it is better to obtain desirable optical characteristics of the reduction projection exposure apparatus by simulation and based on experimental results in consideration of deformation of the pattern depending upon the resist characteristics. In this manner, it is possible to obtain a pattern form capable of reducing deformation of the connecting portion of the projected patterns. Furthermore, a method of forming a transfer pattern without defects by performing repair, has been explained. Repairing the pattern is one of applications of the present invention. The present invention can be applied to a technique for forming a transfer pattern by modifying a part of the pattern on the original mask or by newly adding a pattern thereto.

In the embodiments, a photomask is used as the substrate and a pattern of the original mask was transferred onto the photomask. However, the present invention can be applied to the case where a semiconductor wafer is used as the substrate. More specifically, the present invention can be applied to the case where a pattern of the photomask serving as an original mask is transferred to a semiconductor wafer serving as a substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern comprising:
    preparing a main pattern and spare patterns on at least one original mask before performing a defect inspection of the main pattern;
    performing the defect inspection of the main pattern to determine positions and types of defects;
    selectively forming an opaque film on defective portions including the defects of the main pattern in a main pattern region of the original mask on which an LSI pattern is formed, to prevent the defective portions from being transferred;
    transferring the main pattern region of the original mask to a substrate to be exposed; and
    transferring at least one spare pattern selected from the prepared spare patterns to a portion of the substrate corresponding to each of the defective portions covered by the opaque film of the original mask.

2. The method of forming a pattern according to claim 1, wherein the at least one spare pattern is formed on a spare pattern region other than the main pattern region of the original mask.

3. The method of forming a pattern according to claim 1, wherein the at lest one spare pattern is formed on another original mask other than the original mask.

4. The method of forming a pattern according to claim 1, wherein the step of forming the opaque film includes the steps of:
    forming an LSI pattern at least in the main pattern region of the original mask on the basis of a design data;
    performing defect inspection for the LSI pattern formed on the original mask to detect positions and types of the defects;
    repairing a repairable defect of the defects; and
    forming the opaque film on each of the defective portions including a non-repairable defect of the defects to prevent the non-repairable defect from being transferred onto the substrate.

5. The method of forming a pattern according to claim 1, wherein
    the step of forming the opaque film includes the steps of:
    forming a large main pattern on the main pattern region of the original mask on the basis of a design data;
    performing defect inspection for the main pattern formed on the original mask to detect positions and types of the defects; and
    forming the opaque film on each of the defective portions including a defect selected from the defects of the main pattern to prevent the defective portions from being transferred onto the substrate, and
    the step of transferring at least one spare pattern on the substrate includes the steps of:
    obtaining data on figure patterns and positions of the defects under the opaque film from one of the design data and an original mask pattern data of the defective region, thereby obtaining a light exposure data for the at least one spare pattern; and
    projecting at least one of the figure patterns of the defects onto a selected region of one of the original mask and another original mask to form the at least one spare pattern.

6. The method of forming a pattern according to claim 1, wherein the at least one spare pattern is selected from the group consisting of a square, a rectangle, a parallelogram having one angle selected from the group of 15°, 30°, 45°, 60° and 75°, an isosceles triangle two identical angles of which include one angle selected from the group of 15°, 30°, 45°, 60° and 75°, and a right triangle having one angle selected from the group of 15° and 30°.

7. The method of forming a pattern according to claim 1, wherein the at least one spare pattern includes a plurality of patterns identical in shape and different in size.

8. The method of forming a pattern according to claim 1, wherein the at least one spare pattern has a portion overlapped with a non-defective portion of the main pattern.

9. The method of forming a pattern according to claim 1, wherein the substrate to be exposed is a photomask.

10. A method of forming a pattern, comprising:

preparing light exposure data of an LSI pattern including a large main pattern and at least one small spare pattern, the at least one small spare pattern being comprised of at least one simple figure pattern;

forming the large main pattern and the at least one small spare pattern on at least one original mask before performing a defect inspection of the large main pattern;

performing the defect inspection of the large main pattern to determine positions and types of defects;

forming an opaque film on a defective portion including a defect selected from the defects of the large main pattern, to prevent the defect selected from being transferred onto the substrate;

transferring the large main pattern of the at least one original mask onto a predetermined region of the substrate; and selectively transferring the at least one small spare pattern onto the defective portion of the at least one original mask with the opaque film formed thereon, to recover a desirable figure.

11. The method of forming a pattern according to claim 10, wherein the at least one simple figure pattern is at least one figure pattern repeatedly emerging in the main pattern.

12. The method of forming a pattern according to claim 10, wherein the at least one small spare pattern is formed on the original mask on which the large main pattern is formed.

13. The method of forming a pattern according to claim 10, wherein the at least one small spare pattern is formed on another original mask other than the original mask on which the large main pattern is formed.

14. The method of forming a pattern according to claim 10, wherein the at least one small spare pattern is selected from the group consisting of a square, a rectangle, a parallelogram having one angle selected from the group of 15°, 30°, 45°, 60° and 75°, an isosceles triangle two identical angles of which one angle selected from the group of 15°, 30°, 45°, 60° and 75°, and a right triangle having one angle selected from the group of 15° and 30°.

15. The method of forming a pattern according to claim 10, wherein the at least one small spare pattern includes patterns identical in shape and different in size.

16. The method of forming a pattern according to claim 10, wherein the at least one small spare pattern has a portion overlapped with non-defective portion of the main pattern.

17. A photomask comprising a mask substrate;

a large main pattern formed on a region of the mask substrate;

at least one small spare pattern formed on another region of the mask substrate, the at least one small spare pattern being constituted of at least one simple figure pattern; and an opaque film covering a predetermined region including a defect of the large main pattern.

18. The photomask according to claim 17, wherein the at least one simple figure pattern includes at least one figure pattern repeatedly emerging in the large main pattern.

19. The photomask according to claim 17, wherein the at least one small spare pattern is selected from the group consisting of a square, a rectangle, a parallelogram having one angle selected from the group of 15°, 30°, 45°, 50° and 75°, an isosceles triangle two identical angles of which include one angle selected from the group of 15°, 30°, 45°, 60° and 75°, and a right triangle having one angle selected from the group of 15° and 30°.

20. The photomask according to claim 17, wherein the at least one small spare pattern includes patterns identical in shape and different in size.

* * * * *

UNITED STATES PATENT AND TRADEMARK OFFICE
CERTIFICATE OF CORRECTION

PATENT NO. : 6,319,637 B1
DATED : November 20, 2001
INVENTOR(S) : Iwao Higashikawa et al.

It is certified that error appears in the above-identified patent and that said Letters Patent is hereby corrected as shown below:

Column 10,
Line 18, "lest" should read -- least --.

Signed and Sealed this

Twenty-eighth Day of May, 2002

Attest:

*Attesting Officer*

JAMES E. ROGAN
*Director of the United States Patent and Trademark Office*